US006893931B1

(12) United States Patent
Howard et al.

(10) Patent No.: US 6,893,931 B1
(45) Date of Patent: May 17, 2005

(54) REDUCING EXTRINSIC BASE RESISTANCE IN AN NPN TRANSISTOR

(75) Inventors: David Howard, Irvine, CA (US);
Marco Racanelli, Santa Ana, CA (US);
Greg D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 63 days.

(21) Appl. No.: 10/290,955

(22) Filed: Nov. 7, 2002

(51) Int. Cl.[7] .............................................. H01L 21/331
(52) U.S. Cl. ...................... 438/312; 438/343; 438/373; 438/528
(58) Field of Search ................................ 438/312, 339, 438/343, 350, 369, 372, 373, 528

(56) References Cited

U.S. PATENT DOCUMENTS 5,159,424 A * 10/1992 Morishita .................... 257/197
5,407,838 A * 4/1995 Ohnishi et al. .............. 438/369
5,512,772 A * 4/1996 Maeda et al. ................ 257/370
6,620,665 B1 * 9/2003 Sugahara et al. ........... 438/184

* cited by examiner

Primary Examiner—Stephen W. Smoot
(74) Attorney, Agent, or Firm—Farjami & Farjami LLP

(57) ABSTRACT

A method for fabricating an NPN bipolar transistor comprises forming a base layer on a top surface of a substrate. The NPN bipolar transistor may be an NPN silicon-germanium heterojunction bipolar transistor. The method for fabricating the NPN bipolar transistor may further comprise a cap layer situated over the base layer. According to this embodiment, the method for fabricating the NPN bipolar transistor further comprises fabricating an emitter over the base layer, where the emitter defines an intrinsic and an extrinsic base region of the base layer. The emitter may comprise, for example, polycrystalline silicon. The method for fabricating the NPN bipolar transistor further comprises implanting germanium in the extrinsic base region of the base layer so as to make the extrinsic base region substantially amorphous. The method for fabricating the NPN bipolar transistor further comprises implanting boron in the extrinsic base region of the base layer.

23 Claims, 4 Drawing Sheets

REDUCING EXTRINSIC BASE RESISTANCE IN AN NPN TRANSISTOR

BACKGROUND OF THE INVENTION

1. Field of the Invention

The present invention is in the field of fabrication of semiconductor devices. More specifically, the invention is in the field of fabrication of NPN transistors.

2. Related Art

In one type of bipolar transistor, and more particularly an NPN heterojunction bipolar transistor ("HBT"), used as an example in the present application, a thin silicon-germanium ("SiGe") layer is grown as the base of the bipolar transistor on a silicon wafer. The NPN SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the NPN SiGe HBT, which are comparable to the more expensive GaAs. Previously, silicon-only devices have not been competitive for use where very high speed and frequency response are required.

The higher gain, speed and frequency response of the NPN SiGe HBT are possible due to certain advantages of silicon-germanium, such as a narrower band gap and reduced resistivity. These advantages make silicon-germanium devices more competitive than silicon-only devices in areas of technology where high speed and high frequency response are required. The advantages of high speed and high frequency response discussed above require, among other things, an NPN SiGe HBT having a thin base layer with low base resistance.

By way of background, in a typical NPN SiGe HBT, a P-type base layer is formed by depositing a P-type doped SiGe film on a silicon substrate. A cap layer is formed over the P-type base layer and doped with a P type dopant, such as boron. An emitter is then formed on the cap layer and doped with an N type dopant, such as arsenic. The emitter also defines an intrinsic base region of the base layer situated directly below the emitter and extrinsic base regions situated on either side of the intrinsic base region. The intrinsic base region of the NPN SiGe HBT is connected to external components or devices via base contacts formed on the extrinsic base regions of the base layer. In an effort to improve device performance by increasing speed and frequency response, semiconductor manufacturers have, among other things, attempted to reduce overall base resistance of the NPN SiGe HBT by reducing the resistance of the extrinsic base regions.

In a conventional attempt to reduce the resistance of the extrinsic base regions of the NPN SiGe HBT, semiconductor manufacturers typically implant the extrinsic base regions with a high concentration of boron, which is a P type dopant that is activated by heat in an anneal process. It is desirable to have a high concentration of boron near the top surface of the extrinsic base regions to reduce base resistance without adding to the undesirable base to collector capacitance. However, boron has an undesirable tendency to easily diffuse when subjected to heat in an anneal process. The extension, perpendicular to the surface of the wafer, of the dopant profile in the diffusion process undesirably increases the base to collector capacitance.

Semiconductor manufacturers have attempted to reduce the diffusion of boron in the extrinsic base regions of the NPN SiGe HBT by greatly reducing the thermal budget after deposition of the base layer of the NPN SiGe HBT. However, NPN SiGe HBTs are often fabricated with metal oxide semiconductor ("MOS") transistors on the same substrate using Bipolar Complementary-Metal-Oxide-Semiconductor ("BiCMOS") technology. In a typical BiCMOS process, the NPN SiGe HBT needs to withstand a CMOS thermal budget required to activate dopants in the MOS devices. The CMOS thermal budget, for example, can include a high temperature, e.g. between approximately 900.0° C. and approximately 1050.0° C., in a rapid anneal for approximately 5 to 30 seconds. However, a large reduction in the thermal budget to accommodate the NPN SiGe HBT can have an undesirable effect on formation of MOS devices in a BiCMOS process.

Thus, there is a need in the art for reducing the extrinsic base resistance in an NPN bipolar transistor, such as an NPN SiGe HBT, without requiring a lower thermal budget or decreasing manufacturability of the NPN bipolar transistor.

SUMMARY OF THE INVENTION

The present invention is directed to reducing extrinsic base resistance and improving manufacturability in an NPN transistor. The present invention addresses and resolves the need in the art for reducing the extrinsic base resistance in an NPN bipolar transistor, such as an NPN SiGe HBT, without decreasing manufacturability of the NPN bipolar transistor.

According to one exemplary embodiment, a method for fabricating an NPN bipolar transistor comprises forming a base layer on a top surface of a substrate. The NPN bipolar transistor may be, for example, an NPN silicon-germanium heterojunction bipolar transistor. The base layer may comprise, for example, silicon-germanium and may have a thickness of between approximately 100.0 Angstroms and approximately 500.0 Angstroms. The method for fabricating the NPN bipolar transistor may further comprise a cap layer situated over the base layer. The cap layer may comprise, for example, polycrystalline silicon and may have a thickness that is less than 100.0 Angstroms.

According to this exemplary embodiment, the method for fabricating the NPN bipolar transistor further comprises fabricating an emitter over the base layer, where the emitter defines an intrinsic and an extrinsic base region of the base layer. The emitter may comprise, for example, polycrystalline silicon. The method for fabricating the NPN bipolar transistor further comprises implanting germanium in the extrinsic base region of the base layer so as to make the extrinsic base region substantially amorphous. The method for fabricating the NPN bipolar transistor further comprises implanting boron in the extrinsic base region of the base layer. Other features and advantages of the present invention will become more readily apparent to those of ordinary skill in the art after reviewing the following detailed description and accompanying drawings.

DETAILED DESCRIPTION OF THE INVENTION

The present invention is directed to reducing extrinsic base resistance and improving manufacturability in an NPN transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
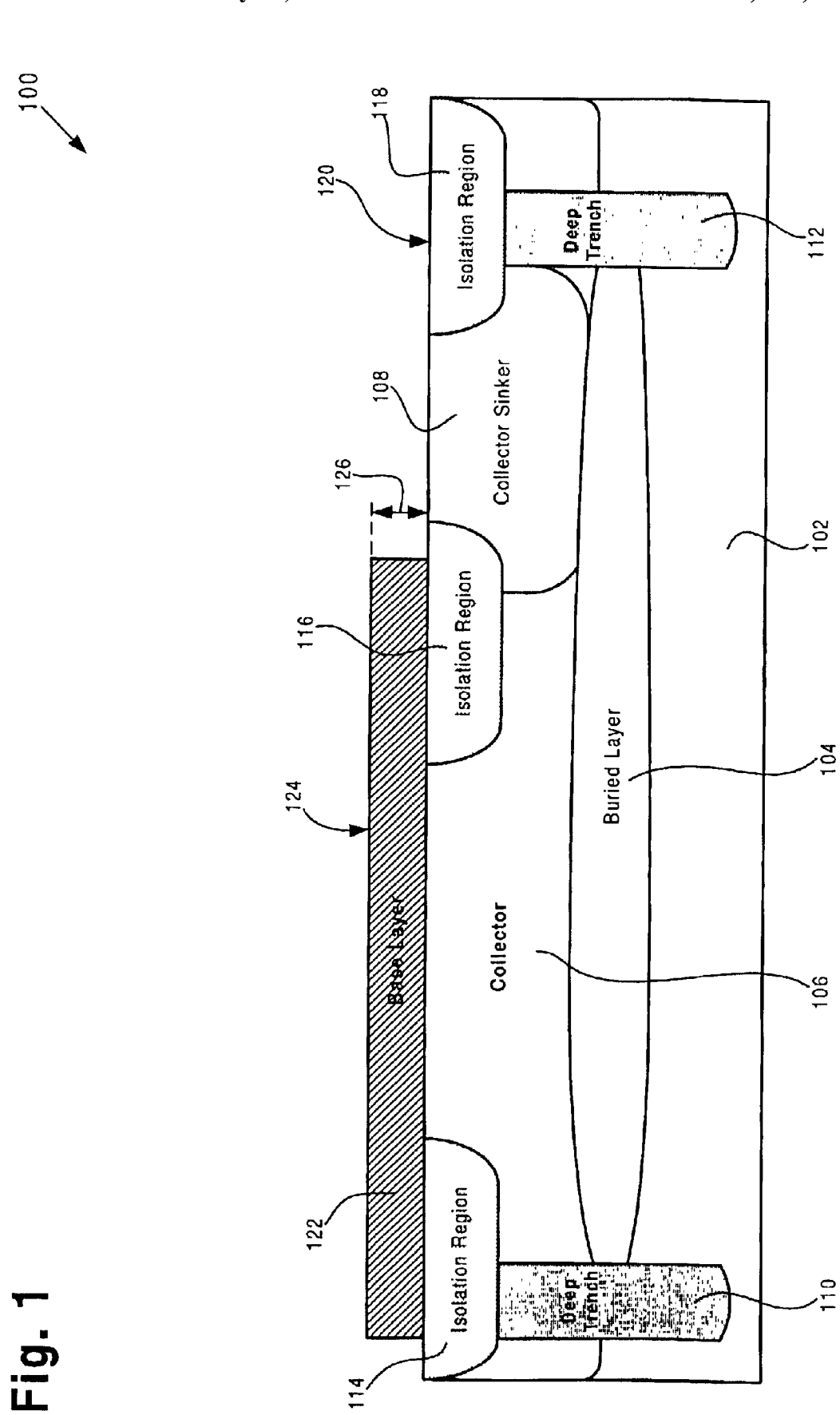
FIG. 1 illustrates a cross-sectional view of some of the features of an exemplary NPN bipolar transistor prior to application of the steps taken to implement an embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Although an exemplary NPN SiGe HBT is described in the present embodiment, other bipolar transistors may be fabricated according to the present invention. Structure 100 includes collector 106 and base layer 122. In the present embodiment, collector 106 is N type single crystal silicon that can be formed using a dopant diffusion process in a manner known in the art.

As shown in FIG. 1, base layer 122 is situated over collector 106 on top surface 120 of silicon substrate 102, resulting in a collector-base junction at the interface of base layer 122 and collector 106. In the present embodiment, base layer 122 can be fabricated by epitaxial deposition of a SiGe film utilizing, for example, a vapor phase epitaxy ("VPE") process, on collector 106 and isolation regions 114 and 116. As a result, base layer 122 comprises SiGe single crystal over collector 106 and polycrystalline SiGe over isolation regions 114 and 116. In one embodiment, base layer 122 may be implanted or grown in-situ with boron ions to achieve P type doping. In the present embodiment, thickness 126 of base layer 122 can be between approximately 100.0 Angstroms and approximately 500.0 Angstroms.

Also shown in FIG. 1, buried layer 104, which comprises N+ type material, i.e. heavily doped N type material, is formed in silicon substrate 102 in a manner known in the art. Collector sinker 108, which comprises N+ type material, is formed by diffusion of heavily concentrated dopants from the surface of collector sinker 108 down to buried layer 104. Buried layer 104, along with collector sinker 108, provide a low resistance electrical pathway from collector 106 through buried layer 104 and collector sinker 108 to a collector contact (the collector contact is not shown in FIG. 1).

As further shown in FIG. 1, deep trench structures 110 and 112 and isolation regions 114, 116, and 118 provide electrical isolation from other devices on silicon substrate 102. Deep trenches 110 and 112 and isolation regions 114, 116, and 118 can comprise silicon dioxide and are formed in a manner known in the art. Although isolation regions 114, 116, and 118 comprise silicon dioxide in the present embodiment, a person skilled in the art will recognize that other materials may be used, such as silicon nitride, a low-k dielectric, or other suitable dielectric material. Isolation regions 114, 116, and 118 may also be field oxide regions, shallow trench isolation oxide ("STI") regions, or local oxidation of silicon, generally referred to as "LOCOS."

Figure 2:
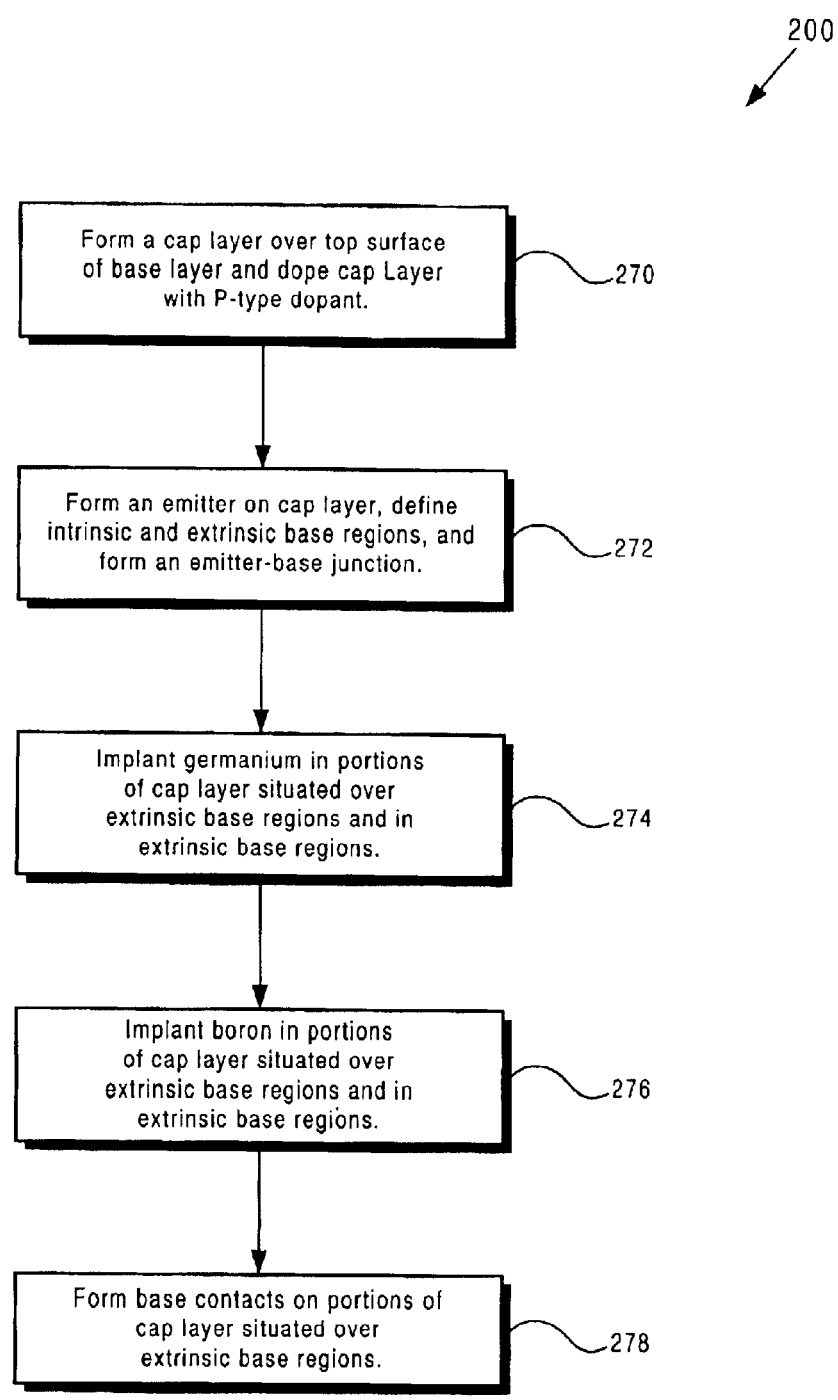
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art. Steps 270 through 278 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1.

Figure 3A:
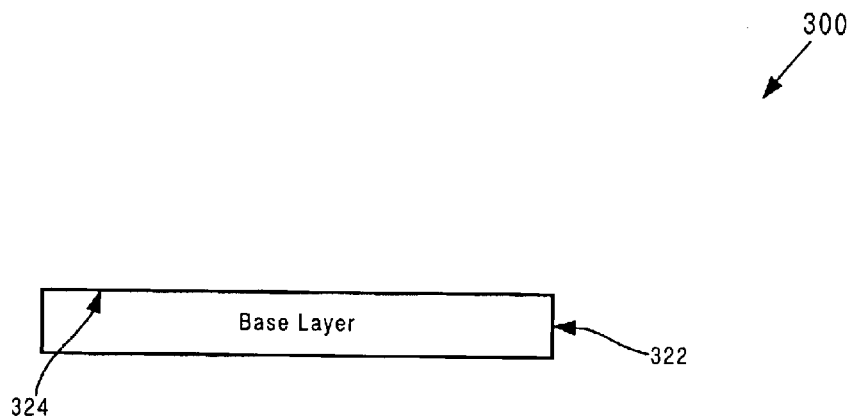
FIG. 3A illustrates a cross sectional view of an exemplary structure corresponding to a portion of the exemplary NPN transistor of FIG. 1 prior to performance of the steps shown in the flowchart of FIG. 2.
Figure 3B:
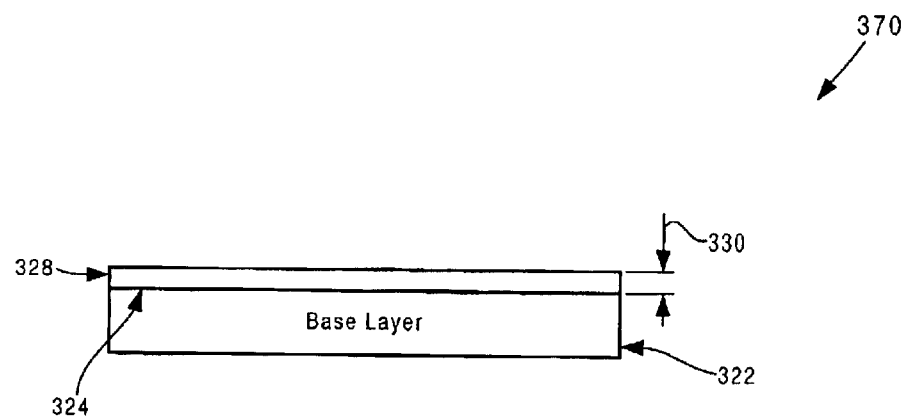
FIG. 3B illustrates a cross sectional view of an exemplary structure after performance of step 270 of FIG. 2, in accordance with one embodiment of the present invention.

Referring now to FIG. 3A, structure 300 of FIG. 3A shows a portion of structure 100 of FIG. 1. Base layer 122 and top surface 124 of structure 100 are shown in structure 300 as base layer 322 and top surface 324, respectively. To preserve brevity, other features, such as silicon substrate 102, buried layer 104, collector 106, collector sinker 108, deep trenches 110 and 112, isolation regions 114, 116, and 118, and top surface 120 are not shown in structure 300. Structure 300 thus shows the portion of a wafer including top surface 324 of base 322, before processing the wafer according to one embodiment of the invention shown in flowchart 200 of FIG. 2. In particular, structure 300 shows a portion of the wafer before processing step 270 of flowchart 200.

Referring to FIGS. 3A, 3B, 3C, 3D, 3E, and 3F, structures 370, 372, 374, 376, and 378 illustrate the result of performing, on structure 300, steps 270, 272, 274, 276, and 278 of flowchart 200 of FIG. 2, respectively. For example, structure 370 shows structure 300 after processing step 270, structure 372 shows structure 370 after the processing of step 272, and so forth.

Continuing with step 270 in FIG. 2 and structure 370 in FIG. 3A, step 270 of flowchart 200 comprises the formation of cap layer 328 over top surface 324 of base layer 322 and doping of cap layer 328. In the present embodiment, cap layer 328 might comprise single crystal or polycrystalline silicon, which may be deposited and patterned on top surface 324 of base layer 322 in a manner known in the art. However, cap layer 328 may also comprise other materials, such as silicon-germanium or other suitable material as known in the art. In the present embodiment, thickness 330 of cap layer 328 can be approximately 100.0 Angstroms. In one embodiment, thickness 330 of cap layer 328 may be less than 100.0 Angstroms. Cap layer 328 is then doped with a medium to high concentration of a P type dopant, such as boron or other P type dopant as known in the art. The thickness, i.e. thickness 330, of cap layer 328 and doping concentration level in cap layer 328, among other things, determine the operating speed as well as manufacturability of the NPN SiGe HBT that includes cap layer 328 and base layer 322. For example, the operating speed of the NPN SiGe HBT that includes cap layer 328 can be increased by making cap layer 328 thinner. By way of further example, increasing the thickness, i.e. thickness 330, of cap layer 328 increases the manufacturability of the NPN SiGe HBT, while increasing the doping concentration level in cap layer 328 causes the NPN SiGe HBT to be more difficult to manufacture. The result of step 270 of flowchart 200 is illustrated by structure 370 in FIG. 3B.

Figure 3C:
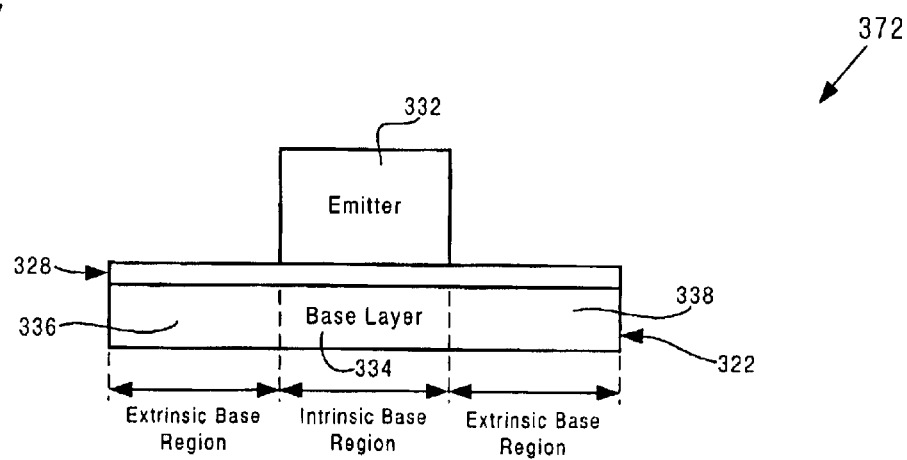
FIG. 3C illustrates a cross sectional view of an exemplary structure after performance of step 272 of FIG. 2, in accordance with one embodiment of the present invention.

Referring to step 272 in FIG. 2 and structure 372 in FIG. 3C, at step 272 of flowchart 200, emitter 332 is formed on cap layer 328. In the present embodiment, emitter 332 comprises N type polycrystalline silicon and may be formed, for example, by depositing, patterning, etching, and doping a layer of polycrystalline silicon with an N type dopant, such as arsenic, in a manner known in the art. In one embodiment, emitter 332 may comprise amorphous silicon, which may be doped with an appropriate N type dopant. Emitter 332 defines intrinsic base region 334, which is a portion of base layer 322 that is situated directly below emitter 332, and extrinsic base regions 336 and 338, which comprise portions of base layer 322 situated adjacent to the sides of intrinsic base region 334.

Intrinsic base region 334 forms the base of the NPN SiGe HBT that includes emitter 332. As discussed above, emitter 332 is doped with an N type dopant and cap layer 328, which is situated between intrinsic base region 334 and emitter 332, is doped with a P type dopant. By application of heat to structure 372, the N type dopant in emitter 332 and the P type dopant in cap layer 328 diffuse into intrinsic base region 334, resulting in formation of an emitter-base junction. The emitter-base junction may be formed by heat applied in an annealing process as known in the art. The result of step 272 of flowchart 200 is illustrated by structure 372 in FIG. 3C.

Figure 3D:
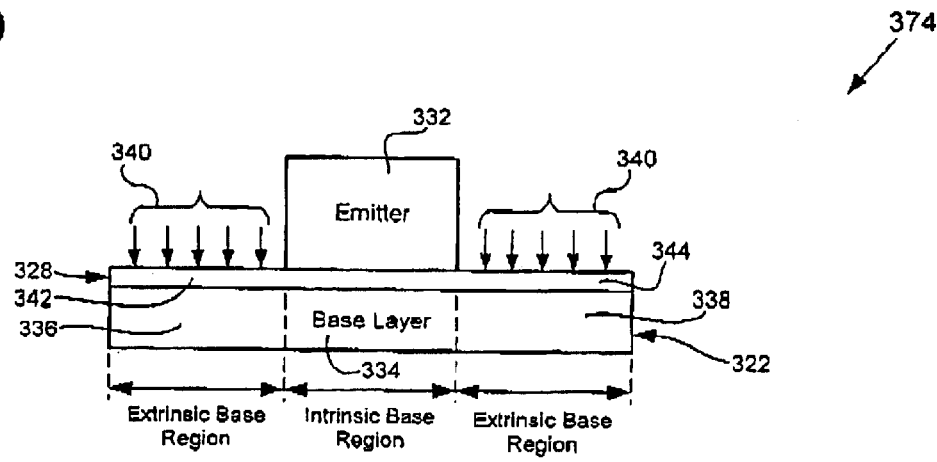
FIG. 3D illustrates a cross sectional view of an exemplary structure after performance of step 274 of FIG. 2, in accordance with one embodiment of the present invention.

Referring to step 274 in FIG. 2 and structure 374 in FIG. 3D, at step 274 of flowchart 200, germanium is implanted in cap layer portions 342 and 344, which are situated over extrinsic base regions 336 and 338, respectively. In the present embodiment, germanium is implanted in cap layer portions 342 and 344 via germanium implant 340. As a result of germanium implant 340, some germanium atoms will penetrate cap layer portions 342 and 344 and enter extrinsic base regions 336 and 338, respectively. The quantity of germanium atoms that are implanted in extrinsic base regions 336 and 338 is determined by the dose of implanted ions and the implanter energy level utilized to perform germanium implant 340, among other things. Germanium implant 340 improves activation of boron, which is implanted in cap layer portions 342 and 344 and extrinsic base regions 336 and 338 in a subsequent processing step. As a result of improved boron activation caused by germanium implant 340, the resistance of cap layer portions 342 and 344 and extrinsic base regions 336 and 338 is reduced. In addition, the Boron dopant profile perpendicular to the wafer surface is more abrupt after the thermal cycle and diffusion process, which has the added benefit of a reduced collector-base junction capacitance.

A germanium implant 340 prevents undesirable channeling effects by causing amorphization of the crystalline structure of cap layer portions 342 and 344 and extrinsic base regions 336 and 338. By way of background, channeling effects occurs in crystalline structures whereby lattice planes act like channels in which implanted atoms can travel without colliding or interacting with other atoms. Amorphization refers to the process whereby a crystalline structure is altered to remove long-range lattice periodicity, which minimizes channeling effects. Thus, as a result of amorphization caused by germanium implant 340, cap layer portions 342 and 344 and extrinsic base regions 336 and 338 have a much greater ability to prevent atoms, such as boron atoms that will be implanted in a subsequent step, from channeling through cap layer portions 342 and 344 and extrinsic base regions 336 and 338. The result of step 274 of flowchart 200 is illustrated by structure 374 in FIG. 3D.

Figure 3E:
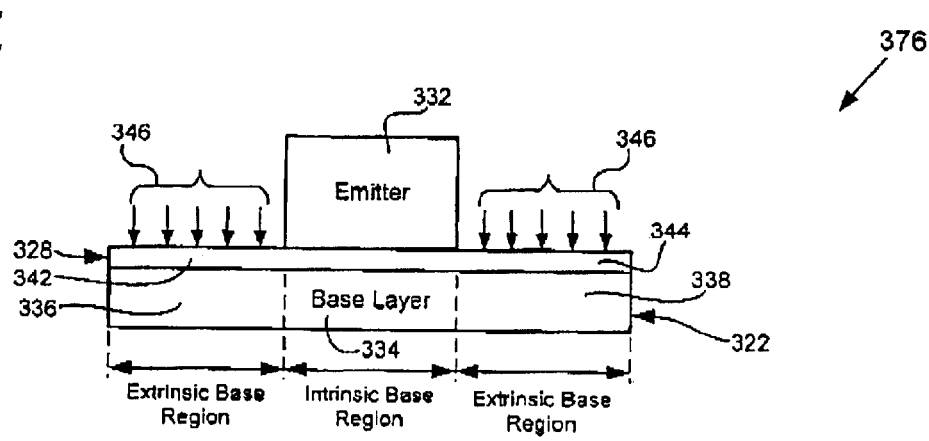
FIG. 3E illustrates a cross sectional view of an exemplary structure after performance of step 276 of FIG. 2, in accordance with one embodiment of the present invention.

Referring to step 276 in FIG. 2 and structure 376 in FIG. 3E, at step 276 of flowchart 200, boron is implanted in cap layer portions 342 and 344, which are situated over extrinsic base regions 336 and 338, respectively. In the present embodiment, boron is implanted in cap layer portions 342 and 344 via boron implant 346. In the present embodiment, boron implant 346 can be performed at zero "tilt." In one embodiment, boron implant 346 can be performed at a non-zero "tilt." As a result of boron implant 346, some boron atoms will penetrate cap layer portions 342 and 344 and enter extrinsic base regions 336 and 338, respectively. The quantity of boron atoms that are implanted in extrinsic base regions 336 and 338 is determined by the dose of implanted ions and the implanter energy level utilized to perform boron implant 346, among other things. As a result of germanium implant 340 performed in step 274, the diffusion of boron atoms in directions both perpendicular to and in parallel with the surface of the wafer is reduced, which increases dopant profile control over boron implant 346. Thus, by utilizing germanium implant 340 to increase dopant profile control over boron implant 346, the present invention's NPN transistor advantageously achieves increased manufacturability compared to an NPN transistor utilizing only a boron implant in extrinsic base regions. Furthermore, by utilizing germanium implant 340 prior to boron implant 346, the present invention advantageously achieves an approximate 15.0% increase in activation of boron for the same nominal base-collector junction depth, which results in an approximate 15.0% decrease in resistance of cap layer portions 342 and 344 and extrinsic base regions 336 and 338. In other embodiment, utilizing germanium implant 340 prior to boron implant 346, the present invention could also advantageously achieve a reduced base-collector junction capacitance from an approximate 20% reduction in the boron dopant depth profile as a result of the controlled diffusion. The result of step 276 of flowchart 200 is illustrated by structure 376 in FIG. 3E.

Figure 3F:
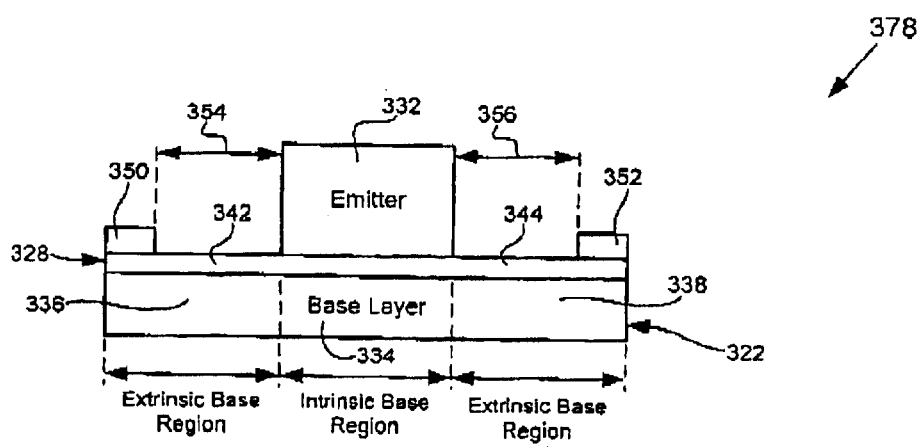
FIG. 3F illustrates a cross sectional view of an exemplary structure after performance of step 278 of FIG. 2, in accordance with one embodiment of the present invention.

Referring to step 278 in FIG. 2 and structure 378 in FIG. 3F, at step 278 of flowchart 200, base contacts 350 and 352 are formed on cap layer portions 342 and 344, respectively. Base contacts 350 and 352 provide electrical connections to intrinsic base region 334 via cap layer portions 342 and 344 and extrinsic base regions 336 and 338, respectively. Base contacts 350 and 352 are situated at distances 354 and 356, respectively, from emitter 332. The result of step 278 of flowchart 200 is illustrated by structure 378 in FIG. 3F.

As discussed above, the present invention utilizes a germanium implant prior to a boron implant in cap layer portions and extrinsic base regions of an NPN transistor. As a result, as discussed above, the present invention achieves greater diffusion control of boron atoms in directions both perpendicular to and in parallel with the surface of the wafer and, consequently, increased manufacturability compared to an NPN transistor utilizing only a conventional boron implant. Furthermore, as discussed above, by utilizing a germanium implant prior to a boron implant, the present invention's NPN transistor achieves reduced extrinsic base resistance without compromising the base to collector capacitance. Accordingly, the present invention's NPN transistor achieves increased performance compared to an NPN transistor utilizing only a conventional boron implant in extrinsic base regions. Moreover, by utilizing a germanium implant to improve activation of a subsequent boron implant, the present invention can advantageously utilize a reduced concentration of boron atoms in the boron implant to achieve a similar extrinsic base resistance as can be achieved without the germanium implant. Further, by utilizing a germanium implant prior to a boron implant, the present invention advantageously achieves an NPN transistor that can be more effectively scaled down in size to provide a desirable narrower emitter dimension. Analogous to the benefits of perpendicular dopant profile control, the diffusion control of the boron dopant parallel to the wafer surface is improved advantageously so as to allow better connection between the intrinsic and extrinsic base regions. Thus, the present invention achieves an NPN transistor also having improved scalability.

It is appreciated by the above detailed description that the invention achieves reduced extrinsic base resistance and increased manufacturability. From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, the principles of the present invention are also applicable to bipolar transistors in general and, in particular, to NPN HBTs using a base layer comprising a material other than SiGe, such as SiGeC ("SiGe—Carbon"). As such, the described embodiments are to be considered in all respects as illustrative and not restrictive. It should also be understood that the invention is not limited to the particular embodiments described herein, but is capable of many rearrangements, modifications, and substitutions without departing from the scope of the invention. For example, the specified layouts, dimensions, and doping levels are provided solely for the purpose of illustrating the present invention by way of a specific example and such dimensions, layouts, and doping levels can be manifestly varied without departing from the scope of the present invention.

Thus, method and structure for reducing extrinsic base resistance and improving manufacturability in an NPN transistor have been described.

What is claimed is:

1. A method for fabricating an NPN bipolar transistor, said method comprising steps of:
   forming a base layer on a top surface of a substrate;
   fabricating an emitter over said base layer, said emitter defining an intrinsic base region and an extrinsic base region of said base layer;
   implanting germanium in said extrinsic base region of said base layer so as to cause said extrinsic base region to be substantially amorphous;
   implanting boron in said extrinsic base region of said base layer after said extrinsic base region is substantially amorphized, and wherein activation of said boron is improved.

2. The method of claim 1 wherein said base layer comprises silicon-germanium.

3. The method of claim 1 wherein said NPN bipolar transistor is an NPN silicon-germanium heterojunction bipolar transistor.

4. The method of claim 1 wherein said emitter comprises polycrystalline silicon.

5. The method of claim 1 wherein a thickness of said base layer is between approximately 100.0 Angstroms and approximately 500.0 Angstroms.

6. The method of claim 1 further comprising a step of forming a cap layer on said base layer after said step of forming said base layer and before said step of fabricating said emitter.

7. The method of claim 6 wherein said step of implanting germanium comprises implanting said germanium in a portion of said cap layer situated over said extrinsic base region, so as to cause said portion of said cap layer to be substantially amorphous.

8. The method of claim 6 wherein said cap layer comprises polycrystalline silicon.

9. The method of claim 6 wherein a thickness of said cap layer is less than 100.0 Angstroms.

10. A method for fabricating an NPN bipolar transistor, said method comprising steps of:
    forming a base layer on a top surface of a substrate;
    forming a cap layer over said base layer;
    fabricating an emitter over said cap layer, said emitter defining an intrinsic base region and an extrinsic base region of said base layer;
    implanting germanium in a portion of said cap layer situated over said extrinsic base region of said base layer so as to cause said portion of said cap layer to be substantially amorphous;
    implanting boron in said portion of said cap layer situated over said extrinsic base region of said base layer.

11. The method of claim 10 wherein said base layer comprises silicon-germanium.

12. The method of claim 10 wherein said NPN bipolar transistor is an NPN silicon-germanium heterojunction bipolar transistor.

13. The method of claim 10 wherein said cap layer comprises polycrystalline silicon.

14. The method of claim 10 wherein a thickness of said base layer is between approximately 100.0 Angstroms and approximately 500.0 Angstroms.

15. The method of claim 10 wherein said emitter comprises polycrystalline silicon.

16. The method of claim 10 wherein a thickness of said cap layer is less than 100.0 Angstroms.

17. A method for fabricating an NPN bipolar transistor, said method comprising steps of:
    forming a base layer on a top surface of a substrate;
    forming a cap layer on said base layer;
    fabricating an emitter over said base layer, said emitter defining an intrinsic base region and an extrinsic base region of said base layer;
    implanting germanium in a portion of said cap layer situated over said extrinsic base region and into said extrinsic base region of said base layer, so as to cause said portion of said cap layer to be substantially amorphous;
    implanting boron in said extrinsic base region of said base layer.

18. The method of claim 17 wherein said base layer comprises silicon-germanium.

19. The method of claim 17 wherein said cap layer comprises polycrystalline silicon.

20. The method of claim 17 wherein said NPN bipolar transistor is an NPN silicon-germanium heterojunction bipolar transistor.

21. The method of claim 17 wherein said emitter comprises polycrystalline silicon.

22. The method of claim 17 wherein a thickness of said cap layer is less than 100.0 Angstroms.

23. The method of claim 17 wherein a thickness of said base layer is between approximately 100.0 Angstroms and approximately 500.0 Angstroms.

* * * * *